(12) United States Patent
Kato et al.

(10) Patent No.: US 8,690,070 B2
(45) Date of Patent: *Apr. 8, 2014

(54) WIRELESS IC DEVICE COMPONENT AND WIRELESS IC DEVICE

(71) Applicant: Murata Manufacturing Co., Ltd., Nagaokakyo (JP)

(72) Inventors: Noburo Kato, Nagaokakyo (JP); Yuya Dokai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/794,929

(22) Filed: Mar. 12, 2013

(65) Prior Publication Data

US 2013/0200163 A1  Aug. 8, 2013

Related U.S. Application Data

(63) Continuation of application No. 13/241,823, filed on Sep. 23, 2011, now Pat. No. 8,418,928, which is a continuation of application No. PCT/JP2010/056559, filed on Apr. 13, 2010.

(30) Foreign Application Priority Data

Apr. 14, 2009 (JP) ................................. 2009-098437
Aug. 12, 2009 (JP) ................................. 2009-187318

(51) Int. Cl.
*G06K 19/06* (2006.01)

(52) U.S. Cl.
USPC .......................................... 235/492; 235/487

(58) Field of Classification Search
USPC .................................................. 235/487, 492
See application file for complete search history.

(56) References Cited

U.S. PATENT DOCUMENTS

| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |

(Continued)

FOREIGN PATENT DOCUMENTS

| CA | 2 279 176 A1 | 7/1998 |
| DE | 10 2006 057 369 A1 | 6/2008 |

(Continued)

OTHER PUBLICATIONS

Official Communication issued in International Patent Application No. PCT/JP2009/056934, mailed on Jun. 30, 2009.

(Continued)

*Primary Examiner* — Daniel St Cyr
(74) *Attorney, Agent, or Firm* — Keating & Bennett, LLP

(57) ABSTRACT

A wireless IC device includes a wireless IC chip, a coupling electrode, and a radiation plate. The coupling electrode includes coupling portions arranged to be coupled to the wireless IC chip and a pair of opposing ends. The pair of opposing ends are capacitively coupled to each other and oppose the radiation plate to be coupled to the radiation plate. The wireless IC chip uses the radiation plate as an antenna to transmit and receive signals having certain frequencies to and from an RFID system.

7 Claims, 12 Drawing Sheets

(56) References Cited

U.S. PATENT DOCUMENTS

| | | |
|---|---|---|
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 8,418,928 B2 * | 4/2013 | Kato et al. ............ 235/492 |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0133605 A1 | 6/2005 | Koyama et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0114159 A1 | 6/2006 | Yoshikawa et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0208900 A1 | 9/2006 | Tavassoli Hozouri |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200705 A1 | 8/2007 | Yamagajo et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0252770 A1 | 11/2007 | Kai et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0087990 A1 | 4/2008 | Kato et al. |
| 2008/0111695 A1 | 5/2008 | Yamagajo et al. |
| 2008/0129606 A1 | 6/2008 | Yanagisawa et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0066466 A1 | 3/2009 | Arimura |
| 2009/0080296 A1 | 3/2009 | Dokai et al. |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |
| 2009/0134979 A1 | 5/2009 | Tsukamoto et al. |
| 2009/0140947 A1 | 6/2009 | Sasagawa et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |

(56) References Cited

U.S. PATENT DOCUMENTS

| | | | |
|---|---|---|---|
| 2011/0063184 A1 | 3/2011 | Furumura et al. | |
| 2011/0186641 A1 | 8/2011 | Kato et al. | |
| 2011/0253795 A1* | 10/2011 | Kato | 235/492 |

FOREIGN PATENT DOCUMENTS

| | | |
|---|---|---|
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 09-093029 A | 4/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-069533 A | 3/1998 |
| JP | 10-69533 A | 3/1998 |
| JP | 10-084406 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 A | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |

(56) References Cited

FOREIGN PATENT DOCUMENTS

| | | |
|---|---|---|
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-104344 A | 4/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-166176 A | 6/2004 |
| JP | 2004-213582 A | 7/2004 |
| JP | 2004-519916 A | 7/2004 |
| JP | 2004/070879 A | 8/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |

(56) References Cited

FOREIGN PATENT DOCUMENTS

| | | |
|---|---|---|
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-013120 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |
| JP | 2007-241789 A | 9/2007 |
| JP | 2007-249620 A | 9/2007 |
| JP | 2007-266999 A | 10/2007 |
| JP | 2007-272264 A | 10/2007 |
| JP | 2007-287128 A | 11/2007 |
| JP | 2007-295177 A | 11/2007 |
| JP | 2007-295395 A | 11/2007 |
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-182438 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-027291 A | 2/2009 |
| JP | 2009-27291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |

(56) References Cited

FOREIGN PATENT DOCUMENTS

| | | |
|---|---|---|
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 2009-182630 A | 8/2009 |
| JP | 2009-213169 A | 9/2009 |
| JP | 2009-213171 A | 9/2009 |
| JP | 2009-260758 A | 11/2009 |
| JP | 2009-284182 A | 12/2009 |
| JP | 2010-009196 A | 1/2010 |
| JP | 2010-050844 A | 3/2010 |
| JP | 2010-051017 A | 3/2010 |
| JP | 2010-081571 | 4/2010 |
| JP | 4609604 B2 | 1/2011 |
| JP | 2011-205384 A | 10/2011 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 2004/072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/049068 A1 | 5/2006 |
| WO | 20061048663 A1 | 5/2006 |
| WO | 2006/121104 A1 | 11/2006 |
| WO | 2007/013168 A1 | 2/2007 |
| WO | 2007/083574 A1 | 7/2007 |
| WO | 2007/083575 A1 | 7/2007 |
| WO | 20071083574 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/119854 A1 | 10/2010 |

OTHER PUBLICATIONS

Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.

(56) References Cited

OTHER PUBLICATIONS

Official Communication issued in International Patent Application No. PCT/JP2009/053690, mailed on Jun. 2, 2009.
Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags")", RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399, mailed on Aug. 25, 2008.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official Communication in International Application No. PCT/JP2008/050356, mailed on Mar. 25, 2008.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Doaki et al.: "Wireless IC Device"; U.S. Appl. No. 13/738,143, filed Jan. 10, 2013.
Official Communication issued in International Patent Application No. PCT/JP2011/074009, mailed on Dec. 20, 2011.
Kato et al.: "Electromagnetic-Coupling-Module-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.
Official Communication issued in International Patent Application No. PCT/JP2011/073490, mailed on Jan. 10, 2012.
Kato et al.: "Antenna Device and Communication Terminal Apparatus"; U.S. Appl. No. 13/761,195, filed Feb. 7, 2013.
Kato et al.: "Antenna Device and Mobile Communication Terminal"; U.S. Appl. No. 13/767,960, filed Feb. 15, 2013.
Official Communication issued in International Patent Application No. PCT/JP2012/058884, mailed on Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, mailed on May 22, 2012.
Official Communication issued in International Patent Application No. PCT/JP2012/050557, mailed on Apr. 10, 2012.

(56) References Cited

OTHER PUBLICATIONS

Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart Internatioal Application No. PCT/JP2008/056026, mailed Jul. 1, 2008.
Ikemoto et al.; "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,382, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.

(56) References Cited

OTHER PUBLICATIONS

Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.

* cited by examiner

WIRELESS IC DEVICE COMPONENT AND WIRELESS IC DEVICE

BACKGROUND OF THE INVENTION

1. Field of the Invention

The present invention relates to wireless integrated circuit (IC) device components and wireless IC devices. More particularly, the present invention relates to a wireless IC device component and a wireless IC device preferably for use in a Radio Frequency Identification (RFID) system.

2. Description of the Related Art

Hitherto, RFID systems have been developed as article management systems. In such an RFID system, a reader-writer producing an induction electromagnetic-field communicates with an IC chip (also referred to as an IC tag or a wireless IC chip) in a non-contact manner. The IC chip is attached to, for example, an article or a container and stores certain information to be transmitted. The IC chip is coupled to an antenna, that is, a radiation plate to enable communication with the reader-writer.

Japanese Registered Utility Model No. 3148168 discloses a wireless IC device which includes a wireless IC, an annular electrode including a pair of ends, and a matching portion provided on the pair of ends of the annular electrode and in which a dipole radiation plate is connected to a current maximum point of the annular electrode. In the wireless IC device, the wireless IC is coupled to the matching portion and the annular electrode is electromagnetically coupled to the radiation plate. The wireless IC is coupled to the radiation plate via the annular electrode.

In the wireless IC device described above, the use of the annular electrode (coupling electrode) enables the mounting accuracy of the wireless IC to be reduced so as to improve the radiation characteristics. However, such an annular electrode (coupling electrode) has an inductive reactance complementing the impedance and there is a problem in that a long electrical length increases the value of the inductive reactance so as to deteriorate impedance matching between the wireless IC and the radiation plate.

SUMMARY OF THE INVENTION

To overcome the problems described above, preferred embodiments of the present invention provide a wireless IC device component and a wireless IC device that are capable of increasing the electrical length of a coupling electrode and achieving satisfactory impedance matching between a wireless IC and a radiation plate to more satisfactorily couple the coupling electrode to the radiation plate.

A wireless IC device component according to a first preferred embodiment of the present invention preferably includes a wireless IC, and a coupling electrode including at least one coupling portion to be coupled to the wireless IC directly or via a feed circuit and a pair of ends that are capacitively coupled to each other.

A wireless IC device of a second preferred embodiment of the present invention preferably includes a wireless IC, a coupling electrode including at least one coupling portion to be coupled to the wireless IC directly or via a feed circuit and a pair of ends that are capacitively coupled to each other, and a radiation plate coupled to the coupling electrode.

A wireless IC device of a third preferred embodiment of the present invention preferably includes a wireless IC, a coupling electrode including at least one coupling portion to be coupled to the wireless IC directly or via a feed circuit and a pair of opposing ends defined by a cutout of the coupling electrode, and a radiation plate that is opposed to the opposing ends in the coupling electrode so as to be capacitively coupled to the opposing ends.

In the wireless IC device component of the first preferred embodiment and the wireless IC device of the second preferred embodiment, the coupling electrode is preferably defined by an annular electrode via the pair of ends that are capacitively coupled to each other. The coupling electrode has an inductive reactance (XL: $j\omega L$) caused by the electrical length and a capacitive reactance (XC: $1/j\omega C$) caused by the pair of ends that are capacitively coupled to each other. Since the inductive reactance has a phase opposite to that of the capacitive reactance, the impedance does not significantly increase because of the increase in the electrical length of the coupling electrode. In other words, it is possible to achieve the impedance matching between the wireless IC and the radiation plate even if the electrical length of the coupling electrode is increased. Specifically, since the paired ends in the coupling electrode are capacitively coupled to each other to provide the capacitive reactance, it is necessary for the coupling electrode to have an increased inductive reactance in order to achieve certain impedance and the electrical length of the coupling electrode is increased. The increased electrical length causes the coupling electrode to receive an increased amount of magnetic field from the radiation plate and, thus, the magnetic coupling between the coupling electrode and the radiation plate is further strengthened.

In the wireless IC device of the third preferred embodiment, the capacitive and magnetic coupling between the coupling electrode and the radiation plate causes the wireless IC to be coupled to the radiation plate so as to establish communication between the wireless IC and an RFID system in a non-contact manner. The coupling electrode has an inductive reactance (XL: $j\omega L$) caused by the electrical length and a capacitive reactance (XC: $1/j\omega C$) caused by the coupling electrode and the radiation plate. Since the inductive reactance has a phase opposite to that of the capacitive reactance, the impedance does not significantly increase because of the increase in the electrical length of the coupling electrode. In other words, it is possible to achieve the impedance matching between the wireless IC and the radiation plate even if the electrical length of the coupling electrode is increased. Specifically, since the coupling electrode is capacitively coupled to the radiation plate to provide the capacitive reactance, it is necessary for the coupling electrode to have an increased inductive reactance in order to achieve certain impedance and the electrical length of the coupling electrode is increased. The increased electrical length causes the coupling electrode to receive an increased amount of magnetic field from the radiation plate and, thus, the magnetic coupling between the coupling electrode and the radiation plate is further strengthened.

When the wireless IC is a chip type wireless IC and is directly coupled to the coupling electrode, for example, the coupling electrode preferably performs the impedance matching between the wireless IC chip and the radiation plate. The wireless IC may be indirectly coupled to the coupling electrode via a feed circuit board including a feed circuit, i.e., a resonant circuit and/or a matching circuit. In this case, the feed circuit preferably performs the impedance matching with the wireless IC and the coupling electrode preferably performs the impedance matching between the feed circuit and the radiation plate.

When the coupling electrode is capacitively coupled to the radiation plate via the opposing ends, the mounting accuracy of the coupling electrode in the wireless IC on the radiation plate is not strictly limited. The same applies to the case in which the wireless IC is mounted on the feed circuit board.

In addition, the frequency of a signal used in the communication with a reader-writer is substantially determined by the feed circuit including the resonant circuit and/or the matching circuit which have a certain resonant frequency. The feed circuit is preferably designed in accordance with the impedances of the wireless IC and the radiation plate to be used to adapt to various impedances and to broaden the frequency band in which the impedance matching is enabled. Furthermore, arranging the coupling electrode so that the coupling electrode is coupled to the feed circuit and the radiation plate enables a signal to be efficiently transmitted from the radiation plate via the coupling electrode, so as to improve the radiation characteristics of the signal.

According to various preferred embodiments of the present invention, it is possible to increase the electrical length of the coupling electrode and to achieve satisfactory impedance matching between the wireless IC and the radiation plate. As a result, it is possible to more satisfactorily couple the coupling electrode to the radiation plate.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a front view and FIG. 3B is a perspective view.

FIG. 5A is a plan view and FIG. 5B is an exploded perspective view.

FIG. 9A is a plan view showing a state in which a feed circuit board is installed and FIG. 9B is a plan view showing a state in which the feed circuit board is removed.

FIG. 17A is a perspective view and FIG. 17B is a developed view of a coupling electrode.

FIG. 19A is a cross-sectional view and FIG. 19B is a perspective view of a coupling electrode.

DETAILED DESCRIPTION OF THE PREFERRED EMBODIMENTS

Figure 1:
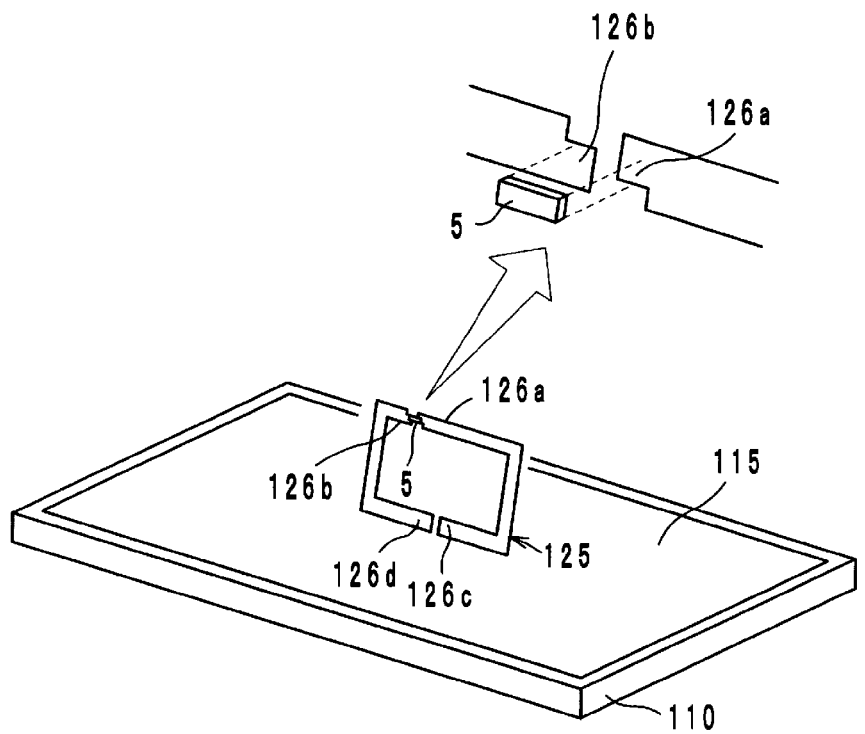
FIG. 1 is a perspective view showing a wireless IC device according to a first preferred embodiment of the present invention.

Preferred embodiments of a wireless IC device component and a wireless IC device according to the present invention will be described with reference to the attached drawings. In the description, the wireless IC device preferably includes a radiation plate and the wireless IC device component is defined as the wireless IC device with the radiation plate being omitted. The radiation plate is preferably provided at the side of an article and the wireless IC device component is coupled to the radiation plate to define the wireless IC device. The same reference numerals are used in the drawings to identify the same or substantially the same components and portions. A duplicated description of such components and portions is omitted herein.

First Preferred Embodiment

A wireless IC device according to a first preferred embodiment of the present invention preferably includes a wireless IC chip 5 arranged to process transmission and reception signals having certain frequencies, a radiation plate 115 provided on a base 110, such as a polyethylene terephthalate (PET) film, for example, and a coupling electrode 125 provided on a base (not shown), such as a PET film, for example, as shown in FIG. 1.

The coupling electrode 125 preferably includes a pair of coupling portions 126a and 126b to be coupled to the wireless IC chip 5 and a pair of opposing ends 126c and 126d defined by a cutout of the coupling electrode 125. The wireless IC chip 5 preferably includes, for example, a clock circuit, a logic circuit, and a memory circuit. Necessary information is stored in the wireless IC chip 5. A pair of input-output terminal electrodes (not shown) is provided on the rear surface of the wireless IC chip 5. The pair of input-output terminal electrodes is mounted on the pair of coupling portions 126a and 126b of the coupling electrode 125 via a conductive adhesive or other suitable adhesive, for example.

The radiation plate 115 preferably includes, for example, a metal laminate made of a conductive material, such as an aluminum foil or a copper foil, that is provided on substantially the entire surface of the base 110. The coupling electrode 125 is preferably arranged so as to be substantially perpendicular to the radiation plate 115 with the opposing ends 126c and 126d being opposed to the radiation plate 115. The opposing end 126c is opposed to the opposing end 126d so as to be capacitively coupled to the opposing end 126d, so that the coupling electrode 125 electrically forms an annular electrode. A lower-side portion of the coupling electrode 125 including the opposing ends 126c and 126d is capacitively and magnetically coupled to the radiation plate 115. The radiation plate 115 may preferably be provided as a portion of an article, for example, without being combined with the coupling electrode 125 in advance.

Preferably, the coupling electrode 125 has a certain length from the coupling portions 126a and 126b to the opposing ends 126c and 126d, has a certain resonant frequency corresponding to the electrical length, and also functions as a matching portion arranged to perform phase matching. In addition, the coupling electrode 125 performs impedance matching between the wireless IC chip 5 and the radiation plate 115.

A transmission signal that is sent from the wireless IC chip 5 and that has a certain frequency is transmitted to the radiation plate 115 via the coupling electrode 125, and a signal having a certain frequency is selected by the coupling electrode 125 from signals received by the radiation plate 115 and the selected signal is supplied to the wireless IC chip 5. Accordingly, in the wireless IC device, the wireless IC chip 5 is operated with the signal received by the radiation plate 115 and the response signal from the wireless IC chip 5 is externally radiated from the radiation plate 115.

In the wireless IC device, the capacitive and magnetic coupling between the coupling electrode 125 and the radiation plate 115 causes the wireless IC chip 5 to be coupled to the radiation plate 115 so as to establish communication between the wireless IC chip 5 and an RFID system in a non-contact manner. Energy is transmitted between the coupling electrode 125 and the radiation plate 115 primarily through the magnetic coupling.

In the wireless IC device, the opposing ends 126c and 126d of the coupling electrode 125 are opposed to the radiation plate so as to be capacitively coupled to the radiation plate. Such capacitive coupling causes the opposing ends 126c and 126d of the coupling electrode 125 to be electrically connected to each other via the radiation plate 115 to electrically form an annular electrode.

The coupling electrode 125 has an inductive reactance (XL: jωL) caused by the electrical length and a capacitive reactance (XC: 1/jωC) caused by the coupling electrode 125 and the radiation plate 115. Since the inductive reactance has a phase opposite to that of the capacitive reactance, the impedance does not significantly increase because of the increase in the electrical length of the coupling electrode 125. In other words, it is possible to achieve the impedance matching between the wireless IC chip 5 and the radiation plate 115 even if the electrical length of the coupling electrode 125 is increased. Thus, the electrical length of the coupling electrode 125 can be increased to strengthen the magnetic coupling between the coupling electrode 125 and the radiation plate 115.

In the first preferred embodiment, the coupling electrode 125 is preferably arranged such that a loop surface of the coupling electrode 125, that is, a surface of the coupling electrode 125 on which the wireless IC chip 5 is disposed, is perpendicular or substantially perpendicular to the radiation plate 115 so as to produce a magnetic field parallel to the radiation plate 115. Consequently, an electric field perpendicular or substantially perpendicular to the radiation plate 115 is produced, a magnetic field is induced by the electric-field loop, and this chain expands the electromagnetic-field distribution. As a result, the wireless IC device is functional even if the wireless IC device is arranged on the metal surface. In addition, it is also possible to cause the metal surface to function as the radiation plate.

Figure 2:
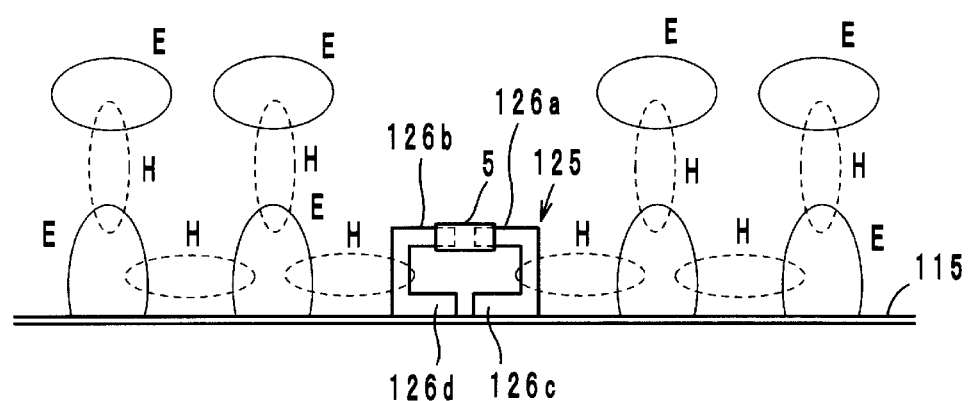
FIG. 2 schematically illustrates an example of electromagnetic-field distribution in the wireless IC device.

FIG. 2 schematically illustrates an example of the electromagnetic-field distribution produced by the coupling electrode 125 (magnetic fields H are indicated by broken lines and electric fields E are indicated by fine lines). The annular coupling electrode 125 functions as a magnetic-field antenna. The coupling electrode 125 causes the magnetic fields H to induce the electric fields E perpendicular or substantially perpendicular to the radiation plate 115, the electric fields E induce the magnetic fields H, and this chain expands the electromagnetic-field distribution. Although the coupling electrode 125 is described as the transmission antenna, the coupling electrode 125 similarly operates as a reception antenna due to the reversibility of the antenna. More specifically, an electromagnetic field induces a magnetic field H, the magnetic field H induces an electric field E perpendicular or substantially perpendicular to the surface of the radiation plate 115, and the electric field E produce a magnetic field H parallel or substantially parallel to the surface of the radiation plate 115, which are coupled to the coupling electrode 125.

The wireless IC device component is functional even if a component on which the wireless IC device component is mounted is made of a metal, and the wireless IC device component similarly operates even if a component on which the wireless IC device component is mounted is an article made of a material other than metal, for example, an electrolyte such as blood, soybean paste, saline solution, or soapy water. When the article on which the wireless IC device component is mounted is a metal or an electrolyte, transmission and reception may be performed from a surface opposite to the surface on which the wireless IC device component is installed because a current passes through the surfaces of the article.

The wireless IC device can preferably use, for example, frequencies within an ultra high frequency (UHF) band (850 MHz to 970 MHz).

As described above, since the resonant frequency of a signal is set by the coupling electrode 125 in the wireless IC device of the first preferred embodiment, the wireless IC device operates as it is even if the wireless IC device is mounted on various articles. Accordingly, variations in the radiation characteristics are prevented or minimized and it is not necessary to change the design of, for example, the radiation plate 115 for each article upon which the wireless IC device is to be mounted. The frequency of a transmission signal radiated from the radiation plate 115 and the frequency of a reception signal to be supplied to the wireless IC chip 5 substantially correspond to the resonant frequency of the coupling electrode 125. Since the frequencies of the transmission and reception signals are determined in the coupling electrode 125, the frequency characteristics do not vary such that stable frequency characteristics are achieved, regardless of the shape, the size, and/or the arrangement relationship of the radiation plate 115, for example, even if the wireless IC device is rounded or is sandwiched between dielectric materials.

Second Preferred Embodiment

Figure 3A:
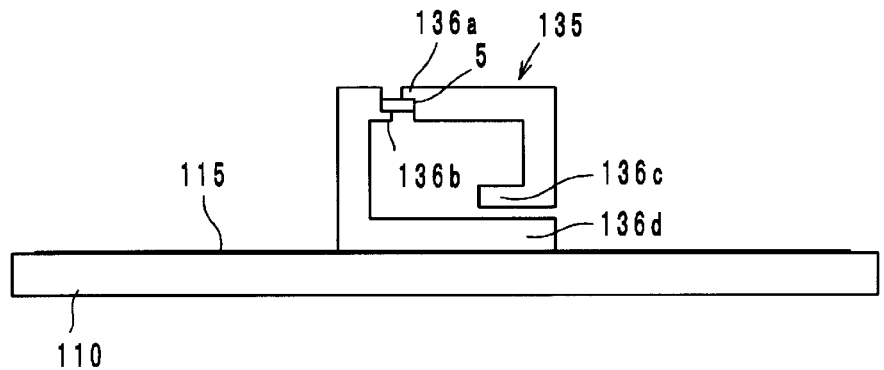
FIGS. 3A and 3B are diagrams showing a wireless IC device component according to a second preferred embodiment of the present invention, where
Figure 3B:
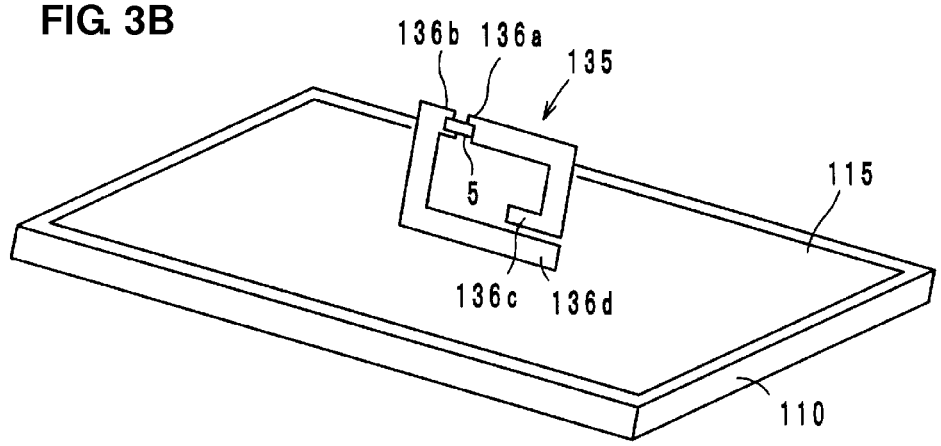

A wireless IC device component according to a second preferred embodiment of the present invention preferably includes a coupling electrode 135, as shown in FIGS. 3A and 3B. The coupling electrode 135 preferably includes a pair of coupling portions 136a and 136b arranged to be coupled to the wireless IC chip 5 and a pair of opposing ends 136c and 136d. The opposing ends 136c and 136d are capacitively coupled to each other.

The opposing end 136c is capacitively coupled to the opposing end 136d, so that the coupling electrode 135 electrically forms an annular electrode and functions as a magnetic-field antenna. The wireless IC device component functions as a wireless IC device with the coupling electrode 135 being coupled to the radiation plate 115, similarly to the coupling electrode 125 shown in the first preferred embodiment.

The coupling electrode 135 has an inductive reactance (XL: jωL) caused by the electrical length and a capacitive reactance (XC: 1/jωC) caused by the paired opposing ends 136c and 136d that are capacitively coupled to each other. Since the inductive reactance has a phase opposite to that of the capacitive reactance, the impedance does not significantly increase because of the increase in the electrical length of the coupling electrode 135. In other words, it is possible to achieve the impedance matching between the wireless IC chip 5 and the radiation plate 115 even if the electrical length of the coupling electrode 135 is increased. Thus, the electrical length of the coupling electrode 135 may be increased to strengthen the magnetic coupling between the coupling electrode 135 and the radiation plate 115.

As in the first preferred embodiment, since the loop surface of the coupling electrode 135 is arranged so as to be perpendicular or substantially perpendicular to the radiation plate 115, the wireless IC device component functions as the wireless IC device even if the wireless IC device component is arranged on the metal surface.

Third Preferred Embodiment

Figure 4:
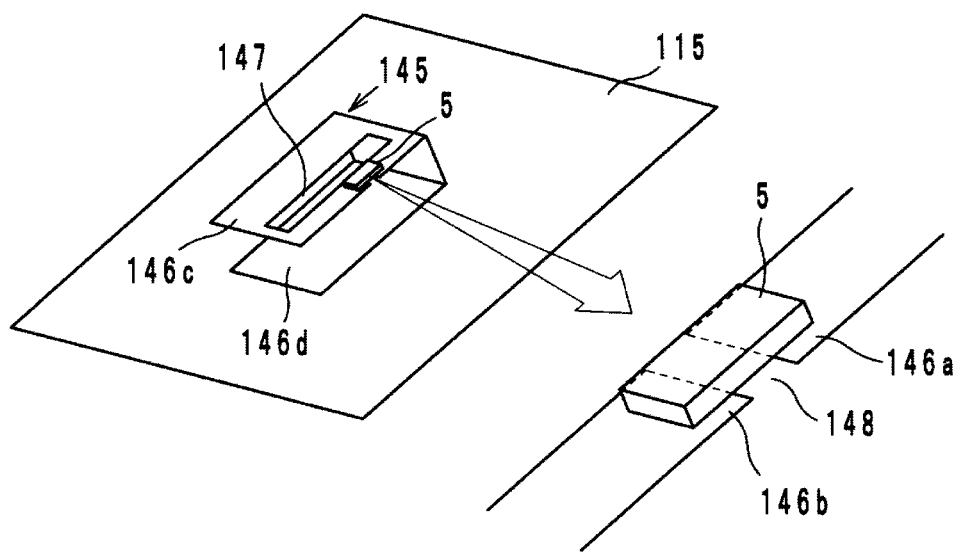
FIG. 4 is a perspective view showing a wireless IC device component according to a third preferred embodiment of the present invention.

A wireless IC device component according to a third preferred embodiment of the present invention preferably includes a coupling electrode 145 having a U-shape in a side view, as shown in FIG. 4. The coupling electrode 145 is preferably provided from the front surface of a base (not shown) made of resin, for example, to the rear surface thereof and includes an opening 147 and a slit 148 extending to the opening 147 on its surface. The opening 147 and the slit 148 define a pair of coupling portions 146a and 146b to be coupled to the wireless IC chip 5. The coupling electrode 145 includes opposing ends 146c and 146d. The opposing ends 146c and 146d are capacitively coupled to each other.

The opposing end 146c is capacitively coupled to the opposing end 146d, so that the coupling electrode 145 electrically forms an annular electrode, functions as a magnetic-field antenna, and is coupled to the radiation plate 115. The operational effects of the third preferred embodiment are similar to those of the second preferred embodiment.

The difference in voltage between the opposing ends 146c and 146d is relatively large in the coupling electrode 145 of the third preferred embodiment, such that the opposing end 146c can be capacitively coupled to the opposing end 146d even if the opposing end 146c is a certain distance apart from the opposing end 146d.

Fourth Preferred Embodiment

Figure 5A:
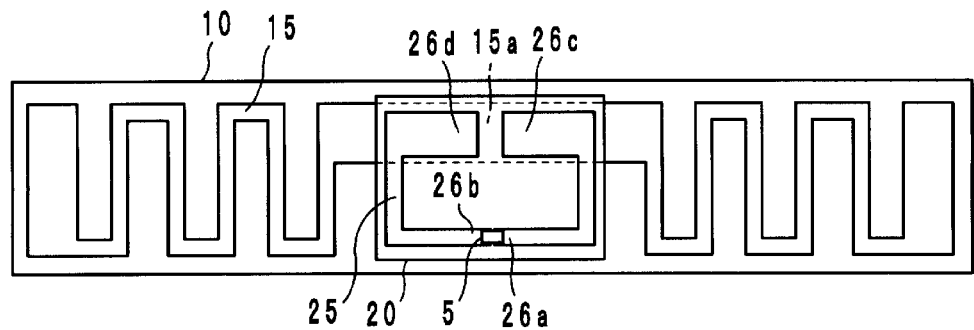
FIGS. 5A and 5B are diagrams showing a wireless IC device according to a fourth preferred embodiment of the present invention, where
Figure 5B:
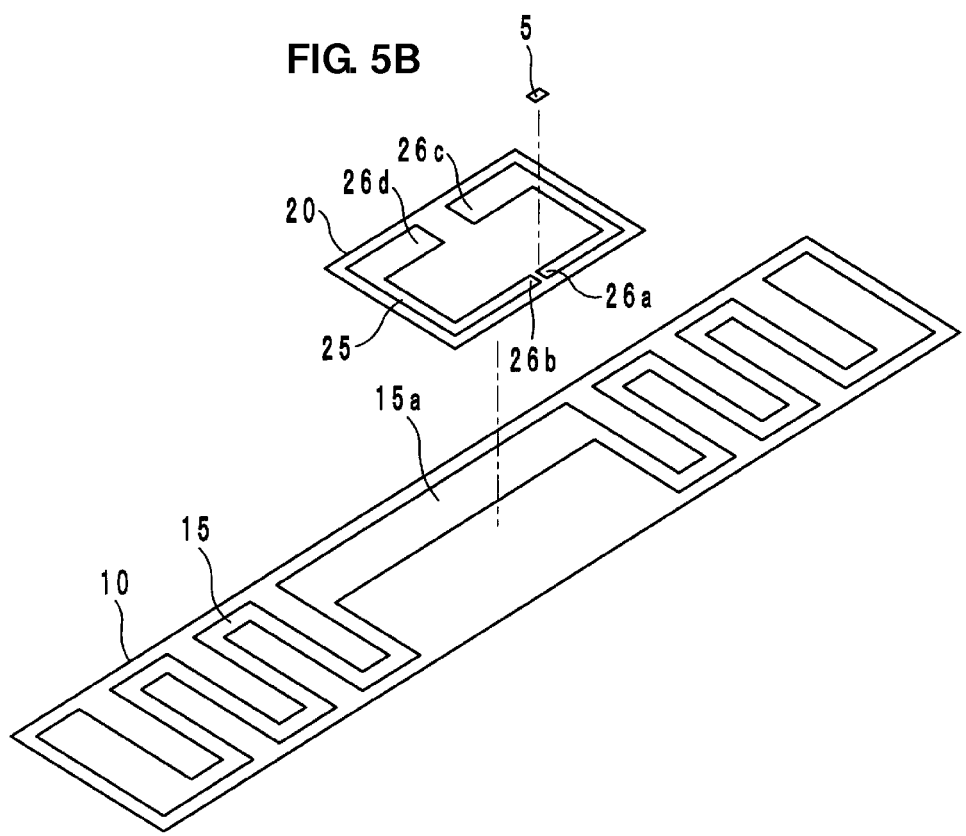

A wireless IC device according to a fourth preferred embodiment of the present invention preferably includes the wireless IC chip 5 arranged to process transmission and reception signals having certain frequencies, a radiation plate 15 provided on a base 10, such as a PET film, for example, and a coupling electrode 25 provided on a base 20, such as a PET film, for example, as shown in FIGS. 5A and 5B.

Figure 6:
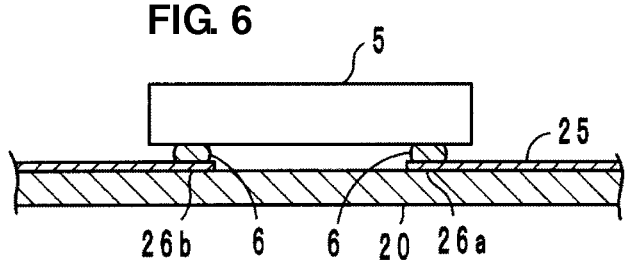
FIG. 6 is a cross-sectional view showing the main portion of the wireless IC device according to the fourth preferred embodiment of the present invention.

The coupling electrode 25 preferably includes a pair of coupling portions 26a and 26b arranged to be coupled to the wireless IC chip 5 and a pair of opposing ends 26c and 26d defined by a cutout of the coupling electrode 25. The wireless IC chip 5 preferably includes, for example, a clock circuit, a logic circuit, and a memory circuit. Necessary information is stored in the wireless IC chip 5. A pair of input-output terminal electrodes (not shown) is provided on the rear surface of the wireless IC chip 5. The pair of input-output terminal electrodes is mounted on the pair of coupling portions 26a and 26b of the coupling electrode 25 via a conductive adhesive 6 in a manner shown in FIG. 6.

The radiation plate 15 preferably has a dipole shape extending toward both ends in a meandering pattern, for example, and includes a midsection 15a of the radiation plate 15 is overlapped with the opposing ends 26c and 26d of the coupling electrode 25 to be capacitively coupled to the opposing ends 26c and 26d. The capacitive coupling between the opposing ends 26c and 26d and the radiation plate 15 causes the opposing ends 26c and 26d to be electrically connected to each other via the radiation plate 15 and, thus, the coupling electrode 25 defines an annular electrode. The radiation plate 15 and the coupling electrode 25 are each preferably provided by attaching a metal thin film made of a conductive material, such as an aluminum foil or a copper foil, for example, on the bases 10 and 20 to form a pattern, applying a conductive paste made of, for example, Al, Cu, or Ag on the bases 10 and 20, or forming a pattern on a film provided by plating.

The coupling electrode 25 preferably has a certain length from the coupling portions 26a and 26b to the opposing ends 26c and 26d, has a certain resonant frequency corresponding to the electrical length, and also functions as a matching portion arranged to perform the phase matching. The radiation plate 15 also has a certain resonant frequency corresponding to the electrical length of the radiation plate 15. In addition, the coupling electrode 25 performs the impedance matching between the wireless IC chip 5 and the radiation plate 15.

Accordingly, a transmission signal that is sent from the wireless IC chip 5 and that has a certain frequency is transmitted to the radiation plate 15 via the coupling electrode 25, and a signal having a certain frequency is selected by the coupling electrode 25 from signals received by the radiation plate 15 and the selected signal is supplied to the wireless IC chip 5. Accordingly, in the wireless IC device, the wireless IC chip 5 is operated with the signal received by the radiation plate 15 and the response signal from the wireless IC chip 5 is externally radiated from the radiation plate 15.

In the wireless IC device, the capacitive coupling between the coupling electrode 25 and the radiation plate 15 causes the wireless IC chip 5 to be coupled to the radiation plate 15 to establish the communication between the wireless IC chip 5 and an RFID system in a non-contact manner. Energy is transmitted between the coupling electrode 25 and the radiation plate 15 primarily through the magnetic coupling.

The coupling electrode 25 has an inductive reactance (XL: jωL) caused by the electrical length and a capacitive reactance (XC: 1/jωC) caused by the coupling electrode 25 and the radiation plate 15. Since the inductive reactance has a phase opposite to that of the capacitive reactance, the impedance does not significantly increase because of the increase in the electrical length of the coupling electrode 25. In other words, it is possible to achieve the impedance matching between the wireless IC chip 5 and the radiation plate 15 even if the electrical length of the coupling electrode 25 is increased. The impedance matching is preferably performed by setting a reactance between the wireless IC chip 5 and one terminal of the coupling electrode 25 and also setting a reactance between the other terminal of the coupling electrode 25 and the radiation plate 15 so as to have a complex conjugate relationship.

In other words, since the coupling electrode 25 is capacitively coupled to the radiation plate 15 to provide the capacitive reactance, it is necessary for the coupling electrode 25 to have a relatively larger inductive reactance in order to achieve a certain impedance and the electrical length of the coupling electrode 25 is increased. The longer electrical length causes the coupling electrode 25 to receive an increased amount of magnetic field from the radiation plate 15 and, thus, the magnetic coupling between the coupling electrode 25 and the radiation plate 15 is further strengthened.

In addition, since the coupling electrode 25 is capacitively coupled to the radiation plate 15 via the opposing ends 26c and 26d, the mounting accuracy of the coupling electrode 25 on the radiation plate 15 is not strictly limited.

A portion of the signals from the coupling electrode 25 is externally radiated from the wireless IC device as the magnetic field and signals are also externally radiated from the radiation plate 15 as the electric field. Designing the coupling electrode 25 so as to have a resonant frequency lower than the resonant frequency of the radiation plate 15 enables the radiation characteristics to be broadened. The radiation plate 15 is capable of long-range communication by using the electric field and the coupling electrode 25 is capable of short-range communication by using the magnetic field.

In addition, since three sides of the coupling electrode 25 are preferably arranged relatively close to the radiation plate 15 and secondary electromagnetic coupling occurs at the proximity portion, the coupling between the coupling electrode 25 and the radiation plate 15 can be further strengthened. Consequently, it is possible to improve the radiation gain of the wireless IC device and to further broaden the radiation characteristics thereof.

As described above, since the resonant frequency of a signal is set in the coupling electrode 25 in the wireless IC device, the wireless IC device operates properly even if the wireless IC device is mounted on various articles. Accordingly, variations in the radiation characteristics are prevented or minimized and it is not necessary to change the design of, for example, the radiation plate 15 for each article upon which the wireless IC device is to be mounted. The frequency of a transmission signal radiated from the radiation plate 15 and the frequency of a reception signal to be supplied to the wireless IC chip 5 substantially correspond to the resonant frequency of the coupling electrode 25. Since the frequencies of transmission and reception signals are determined in the coupling electrode 25, the frequency characteristics do not vary to achieve stable frequency characteristics, regardless of the shape, the size, and/or the arrangement relationship of the radiation plate 15, for example, even if the wireless IC device is rounded or is sandwiched between dielectric materials.

The shape of the radiation plate 15 is not limited to the dipole shape and a radiation plate 65 having an increased area shown in a sixth preferred embodiment of the present invention described below (refer to FIGS. 14 and 15) may be used. In this case, the base 20 is attached on the radiation plate 65. The radiation plate 65 may be a portion of an article. In addition, the midsection 15a of the radiation plate 15 may be narrower or wider than the width shown in FIG. 5. Alternatively, the coupling electrode 25 may be shifted leftward or rightward with respect to the central portion of the radiation plate 15.

Figure 7:
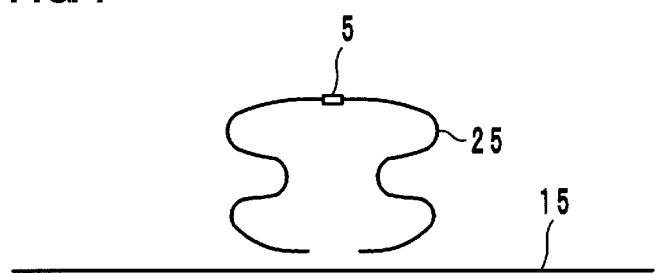
FIG. 7 is a plan view showing a modification of a coupling electrode according to a preferred embodiment of the present invention.

The coupling electrode 25 may have various shapes including an elliptical or substantially elliptical shape, for example, instead of the rectangular or substantially rectangular shape in the fourth preferred embodiment. For example, the coupling electrode 25 may be bent into multiple portions, for example, as shown in FIG. 7. The same applies to other preferred embodiments of the present invention described herein.

Figure 8:
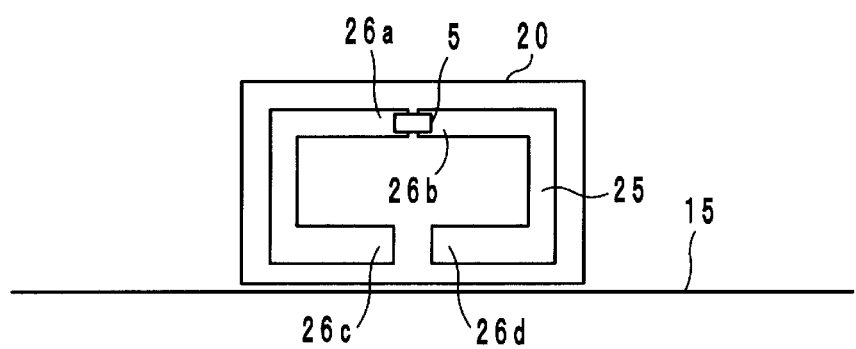
FIG. 8 is an elevation view showing another arrangement of the coupling electrode on a radiation plate.

Alternatively, the coupling electrode 25 may be arranged so as to be perpendicular or substantially perpendicular to the radiation plate 15, as shown in FIG. 8, and the pair of opposing ends 26c and 26d may be capacitively coupled to the radiation plate 15. The arrangement of the loop surface of the coupling electrode 25 so as to be perpendicular or substantially perpendicular to the radiation plate 15 in the above manner causes a magnetic field parallel or substantially parallel to the radiation plate 15 to be produced. Consequently, an electric field perpendicular or substantially perpendicular to the radiation plate 15 is produced, a magnetic-field loop is induced by the electric-field loop, and this chain expands the electromagnetic-field distribution. As a result, the wireless IC device is functional even if the wireless IC device is arranged on the metal surface. The opposing ends 26c and 26d of the coupling electrode 25 may be opposed to the metal surface to be capacitively coupled to the metal surface so as to cause the metal surface to function as the radiation plate 15.

Fifth Preferred Embodiment

Figure 9A:
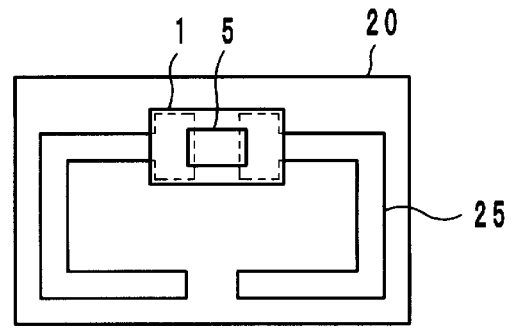
FIGS. 9A and 9B are diagrams showing a coupling electrode of a wireless IC device according to a fifth preferred embodiment of the present invention, where
Figure 9B:
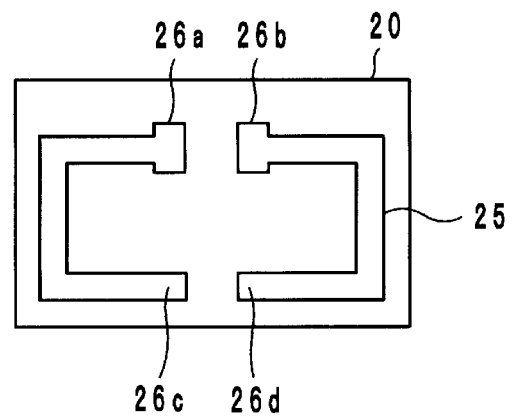

The wireless IC chip 5 may preferably be installed on a feed circuit board 1, as shown in FIGS. 9A and 9B. An example in which the wireless IC chip 5 is installed on the feed circuit board 1 is described as a fifth preferred embodiment of the present invention. The radiation plate 15 preferably including the meandering pattern described in the fourth preferred embodiment or the radiation plate 65 having a larger area described below in the sixth preferred embodiment, for example, may preferably be used as the radiation plate, although not shown. The opposing ends of the coupling electrode 25 are capacitively coupled to the radiation plate 15 or 65.

Figure 10:
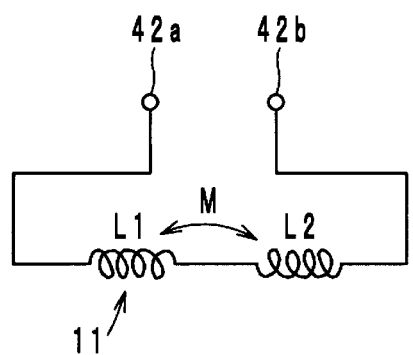
FIG. 10 is an equivalent circuit showing a feed circuit in the wireless IC device according to the fifth preferred embodiment of the present invention.

The feed circuit board 1 preferably includes a feed circuit 11 (described in detail below with reference to FIG. 12) including a resonant circuit and/or a matching circuit including inductance elements L1 and L2 that have opposite phases and that are magnetically coupled to each other (denoted by a mutual inductance M), as shown as an equivalent circuit in FIG. 10.

Figure 11:
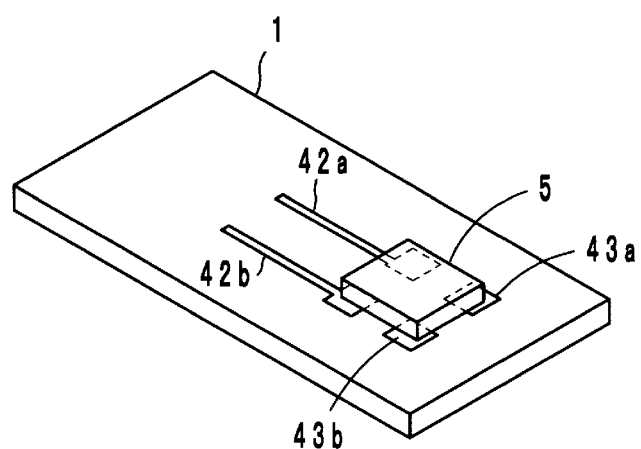
FIG. 11 is a perspective view showing a state in which a wireless IC chip is installed on the feed circuit board included in the wireless IC device according to the fifth preferred embodiment of the present invention.

In the wireless IC chip 5, input-output terminal electrodes are preferably electrically connected to one end of a feed terminal electrode 42a provided on the feed circuit board 1 and to one end of a feed terminal electrode 42b provided thereon, and mounting terminal electrodes are preferably electrically connected to mounting electrodes 43a and 43b via metallic bumps or other suitable structure, for example, as shown in FIG. 11.

The inductance elements L1 and L2 included in the feed circuit 11 have opposite phases and are magnetically coupled to each other to resonate with the frequency processed by the wireless IC chip 5 and to be electromagnetically coupled to the coupling portions 26a and 26b of the coupling electrode 25. The feed circuit 11 performs the impedance matching between the wireless IC chip 5 and the radiation plate 15.

Accordingly, preferably, the feed circuit 11 transmits a transmission signal that is sent from the wireless IC chip 5 and that has a certain frequency to the radiation plate 15 via the coupling electrode 25, and the feed circuit 11 selects a signal having a certain frequency from signals that are received by the radiation plate 15 and that are supplied via the coupling electrode 25 and supplies the selected signal to the wireless IC chip 5. Accordingly, in the wireless IC device, the wireless IC chip 5 is operated with the signal received by the radiation plate 15 and the response signal from the wireless IC chip 5 is externally radiated from the radiation plate 15. In other words, the resonant frequency of the feed circuit 11 substantially corresponds to the frequency of a signal transmitted or received via the radiation plate 15.

The effects of the coupling electrode 25 are the same or substantially the same as those described in the fourth preferred embodiment, and the operational effects of the fifth preferred embodiment are similar to those of the fourth preferred embodiment.

Figure 12:
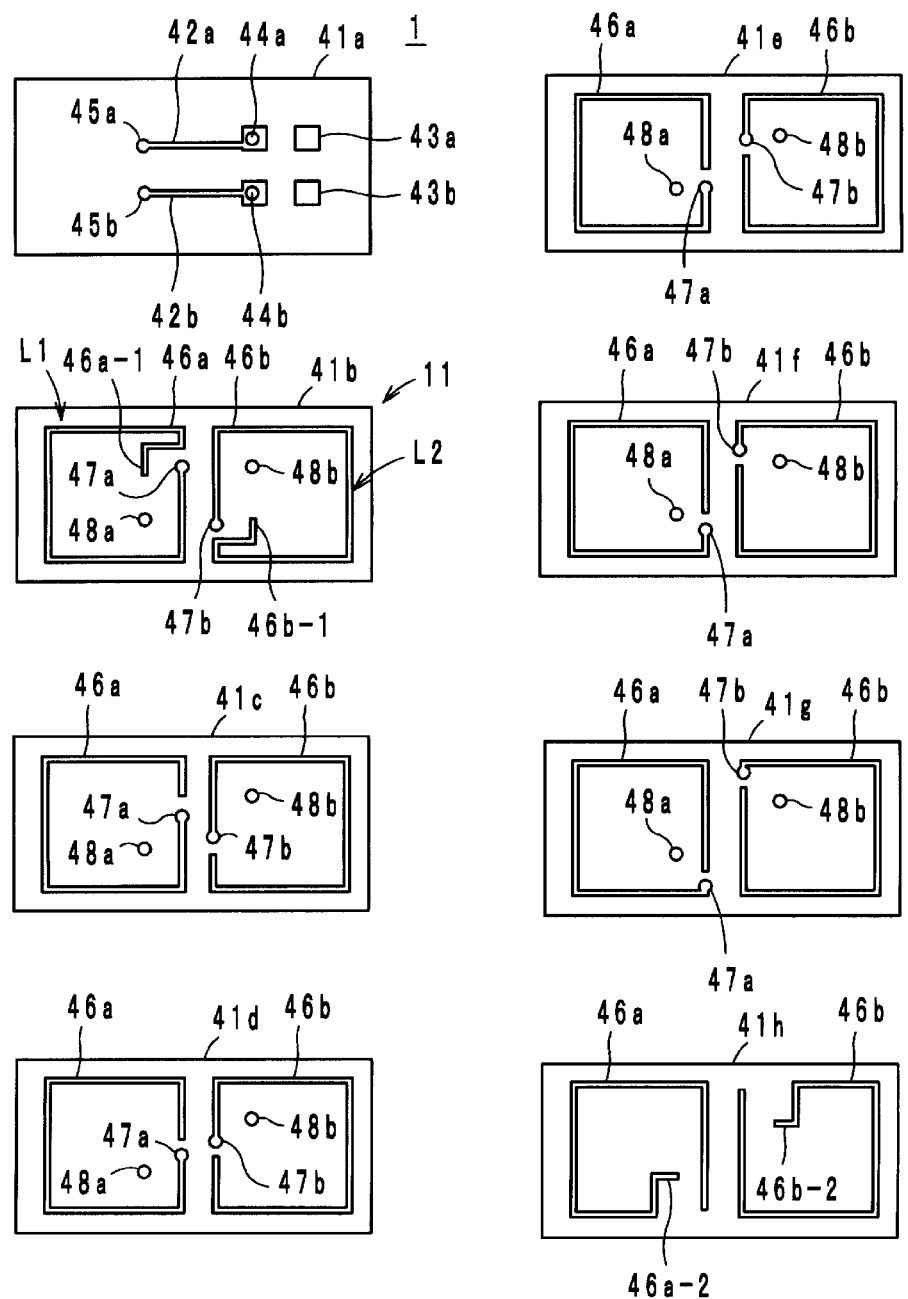
FIG. 12 includes plan views showing a layered structure of the feed circuit board.

The structure of the feed circuit board 1 will now be described with reference to FIG. 12. The feed circuit board 1 is preferably manufactured by stacking, pressure-bonding, and firing ceramic sheets 41a to 41h, each of which is made of a dielectric material or a magnetic material, for example. The top sheet 41a includes the feed terminal electrodes 42a and 42b, the mounting electrodes 43a and 43b, via-hole conductors 44a, 44b, 45a, and 45b provided thereon. The second to eight sheets 41b to 41h each include line electrodes 46a and 46b provided thereon, which define the inductance elements L1 and L2. The second to eighth sheets 41b to 41h each include via-hole conductors 47a, 47b, 48a, and 48b, as required.

Stacking the sheets 41a to 41h provides the inductance element L1 in which the line electrodes 46a are spirally connected via the via-hole conductor 47a and provides the inductance element L2 in which the line electrodes 46b are spirally connected via the via-hole conductor 47b. A capacitance is produced between the line electrodes 46a and 46b.

An end 46a-1 of the line electrode 46a on the sheet 41b is connected to the feed terminal electrode 42a via the via-hole conductor 45a, and an end 46a-2 of the line electrode 46a on the sheet 41h is connected to the feed terminal electrode 42b via the via-hole conductors 48a and 45b. An end 46b-1 of the line electrode 46b on the sheet 41b is connected to the feed terminal electrode 42b via the via-hole conductor 44b, and an end 46b-2 of the line electrode 46b on the sheet 41h is connected to the feed terminal electrode 42a via the via-hole conductors 48b and 44a.

Since the inductance elements L1 and L2 are wound in opposite directions in the feed circuit 11 described above, the magnetic field produced in the inductance element L1 is offset by the magnetic field produced in the inductance element L2. Since the magnetic fields are offset, it is necessary for the line electrodes 46a and 46b to have an increased length in order to achieve a desired inductance value. Increasing the length of the line electrodes 46a and 46b decreases the Q value so as to eliminate or reduce the steepness of the resonance characteristics, thus broadening the resonant characteristics near the resonant frequency.

The inductance elements L1 and L2 are provided at different leftward and rightward positions in a perspective plan view of the feed circuit board 1. The magnetic fields produced by the inductance elements L1 and L2 have opposite directions. Accordingly, coupling the feed circuit to the coupling portions 26a and 26b of the coupling electrode 25 causes currents in opposite directions to be excited in the coupling portions 26a and 26b to allow transmission and reception of signals to and from the radiation plate 15 via the coupling electrode 25.

Figure 13:
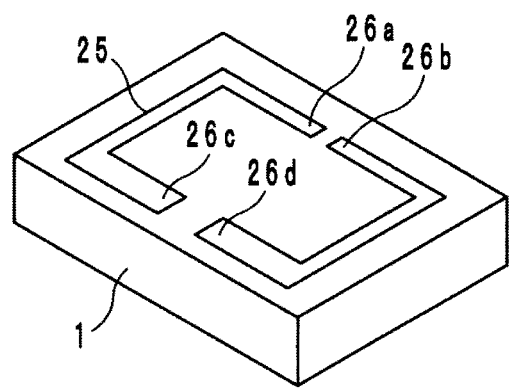
FIG. 13 is a perspective view of an example in which the coupling electrode is provided on the feed circuit board.

In the fifth preferred embodiment using the feed circuit board 1, the coupling electrode 25 may preferably be provided on the rear surface of the feed circuit board 1, as shown in FIG. 13. In this feed circuit board 1, the coupling electrode 25 is arranged so as to be opposed to the radiation plate 15 or the radiation plate 65 to capacitively couple the opposing ends 26c and 26d to the radiation plate 15. Alternatively, the coupling electrode 25 may be arranged so as to be perpendicular or substantially perpendicular to the radiation plate 15 or 65.

The feed circuit board 1 may preferably be a flexible board, for example. The flexible board 1 may be used to attach the board 1 along a curved surface of an article. When the radiation plate 15 is provided as a portion of an article, it is possible to couple the coupling electrode 25 without flexure even if the board 1 is attached along a curved surface of an article because the opposing ends 26c and 26d opposing the radiation plate 15 are spaced apart from each other on one surface of the feed circuit board 1.

Sixth Preferred Embodiment

Figure 14:
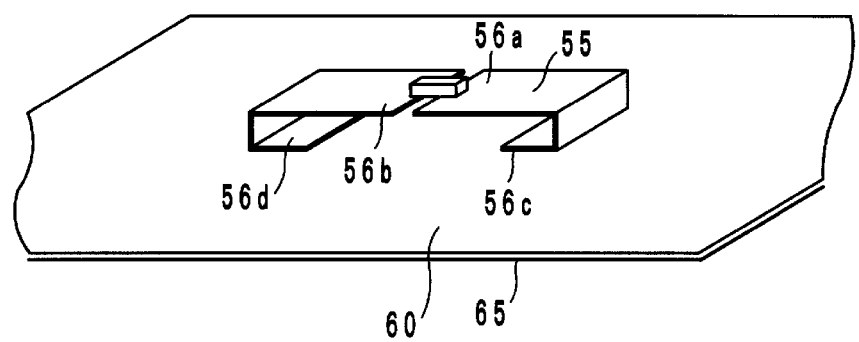
FIG. 14 is a perspective view schematically showing the structure of a wireless IC device according to a sixth preferred embodiment of the present invention.
Figure 15:
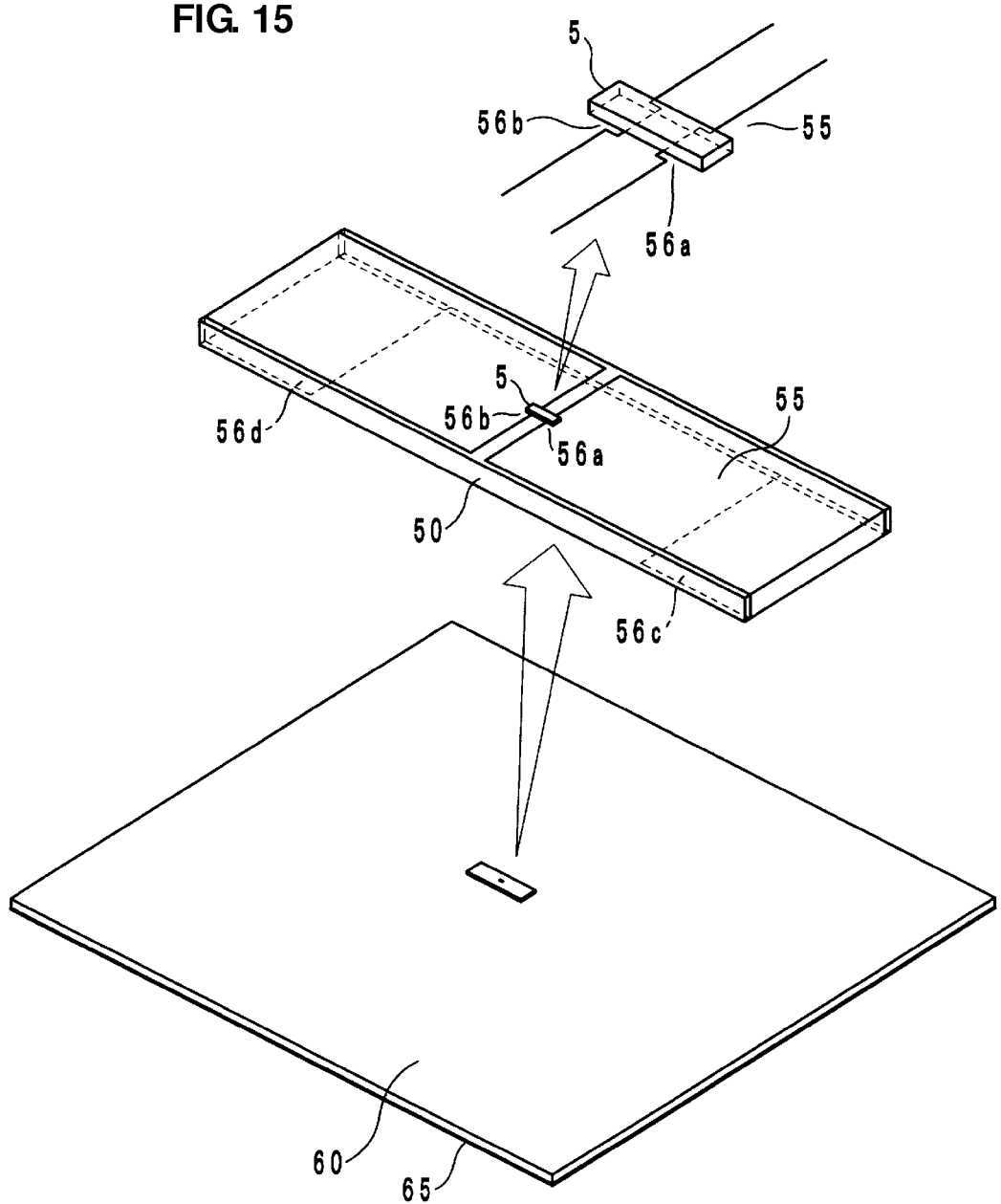
FIG. 15 is a perspective view showing the wireless IC device according to the sixth preferred embodiment of the present invention.

In a wireless IC device according to a sixth preferred embodiment of the present invention, a coupling electrode 55 is provided along surfaces of a flexible dielectric substrate 50 preferably made of polyurethane, for example, which is a wide band, as schematically shown in FIG. 14 and as shown in detail in FIG. 15. The wireless IC chip 5 (or the feed circuit board 1 on which the wireless IC chip 5 is mounted) is preferably mounted on a pair of coupling portions 56a and 56b. A pair of opposing portions 56c and 56d oppose the broad radiation plate 65 provided on the rear surface of a base 60 preferably made of a dielectric material, for example, to be capacitively coupled to the radiation plate 65. The capacitive coupling between the opposing ends 56c and 56d and the radiation plate 65 causes the opposing ends 56c and 56d to be electrically connected to each other via the radiation plate 65 and, thus, the coupling electrode 55 defines an annular electrode. As described above in the first preferred embodiment, arranging the loop surface of the coupling electrode 55 so as to be perpendicular or substantially perpendicular to the radiation plate 65 enables the wireless IC device to be arranged on the metal surface. The metal surface may be caused to function as the radiation plate.

In the sixth preferred embodiment, the opposing ends 56c and 56d of the coupling electrode 55 oppose the radiation plate 65 via the base 60 preferably made of a dielectric material, for example, to be capacitively coupled to the radiation plate 65. The operational effects of the sixth preferred embodiment are the same or substantially the same as the ones described in the first preferred embodiment. In the sixth preferred embodiment, the base 60 and the radiation plate 65 are not necessarily defined by dedicated components of the wireless IC device and may be defined by portions of an article to which the dielectric substrate 50 of the coupling electrode 55 is attached. The radiation plate 65 may be, for example, a ground electrode of an electric device or an electronic device made of metal. In particular, since the dielectric substrate 50 is flexible and the coupling electrode 55 is separated into left and right portions, the coupling electrode 55 can be easily curved and, thus, can be attached along a curved surface of an article.

Figure 16:
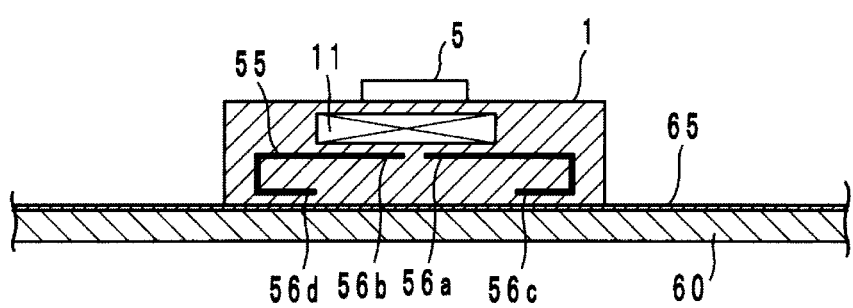
FIG. 16 is a cross-sectional view showing a modification of the wireless IC device according to a preferred embodiment of the present invention.

In the sixth preferred embodiment, the coupling electrode 55 may preferably be incorporated into the feed circuit board 1 shown in the fifth preferred embodiment, along with the feed circuit 11, as shown in FIG. 16. Alternatively, the coupling electrode 55 may preferably be provided on the rear surface of the feed circuit board 1. When the coupling electrode 55 is incorporated into the feed circuit board 1, the opposing ends 56c and 56d of the coupling electrode 55 are capacitively coupled to the radiation plate 65 via the dielectric layers of the board 1. Alternatively, the coupling electrode 55 may be adhered to the radiation plate 65 with a non-conductive adhesive, for example, to capacitively couple the coupling electrode 55 to the radiation plate 65.

Seventh Preferred Embodiment

Figure 17A:
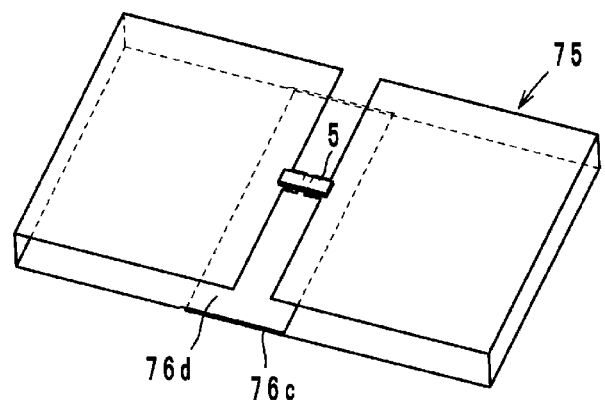
FIGS. 17A and 17B are diagrams showing a wireless IC device component according to a seventh preferred embodiment of the present invention, where
Figure 17B:
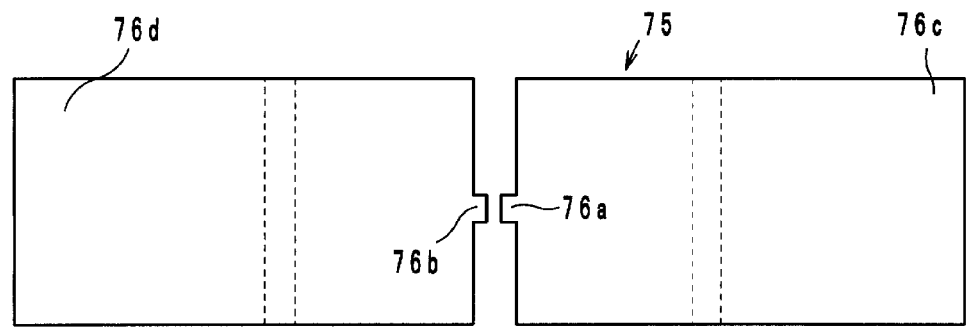

In a wireless IC device component according to a seventh preferred embodiment of the present invention, a coupling electrode 75 is preferably provided along a flexible dielectric substrate (not shown) made of polyurethane, for example, which is a wide band, as shown in FIGS. 17A and 17B. The wireless IC chip 5 (or the feed circuit board on which the wireless IC chip 5 is mounted) is preferably mounted on a pair of coupling portions 76a and 76b. The coupling electrode 75 includes a pair of opposing ends 76c and 76d. The opposing ends 76c and 76d are overlapped with each other on the rear surface of a base to be capacitively coupled to each other.

The opposing end 76c is capacitively coupled to the opposing end 76d, so that the coupling electrode 75 electrically forms an annular electrode and functions as a magnetic-field antenna. The wireless IC device component functions as a wireless IC device with the coupling electrode 75 being coupled to the radiation plate. The operational effects of the seventh preferred embodiment are similar to those of the second preferred embodiment.

As described above in the first preferred embodiment, arranging the loop surface of the coupling electrode 75 so as to be perpendicular or substantially perpendicular to the radiation plate enables the wireless IC device to be arranged on the metal surface. The metal surface may function as the radiation plate.

Eighth Preferred Embodiment

Figure 18:
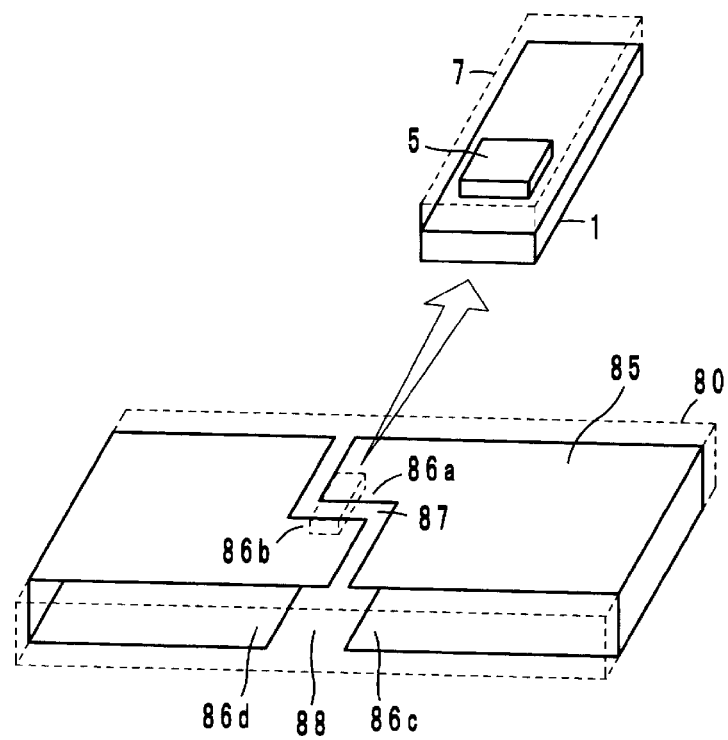
FIG. 18 is a perspective view showing a wireless IC device component according to an eighth preferred embodiment of the present invention.

In a wireless IC device component according to an eighth preferred embodiment of the present invention, a coupling electrode 85 is preferably provided along a flexible dielectric substrate 80 from the top surface of the substrate 80 to the bottom surface thereof via left and right end surfaces thereof, as shown in FIG. 18. The coupling electrode 85 has a longitudinal direction and a latitudinal direction in a plan view, and a slit 87 having a flexion is provided at a substantially central portion of the top surface. A pair of coupling portions 86a and 86b is preferably opposed to each other in the latitudinal direction at a central portion of the slit 87, and the feed circuit board 1 (refer to FIG. 11 and FIG. 12) on which the wireless IC chip 5 is mounted on the coupling portions 86a and 86b. The wireless IC chip 5 is preferably sealed with a resin material 7, for example. The wireless IC chip 5 may be directly mounted on the coupling portions 86a and 86b.

In the coupling electrode 85, preferably, a pair of opposing ends 86c and 86d is adjacent to a slit 88 at a central portion of the bottom surface of the dielectric substrate 80. In the eighth preferred embodiment, the opposing end 86c is capacitively coupled to the opposing end 86d, so that the coupling electrode 85 electrically forms an annular electrode and functions as a magnetic-field antenna. The wireless IC device component functions as a wireless IC device with the coupling electrode 85 being coupled to the radiation plate. The operational effects of the eighth preferred embodiment are similar to those of the seventh preferred embodiment.

In particular, the coupling electrode 85 includes the longitudinal direction and the latitudinal direction in a plan view and the coupling portion 86a opposes the coupling portion 86b in the latitudinal direction in the eighth preferred embodiment. Accordingly, even if the coupling electrode 85 is flexed (the flexible dielectric substrate 80 is likely to be flexed in the longitudinal direction), it is possible to prevent the board 1 and the wireless IC chip 5 from being destroyed or separated from one another due to the flexural stress applied to the feed circuit board 1 and the wireless IC chip 5.

Ninth Preferred Embodiment

Figure 19A:
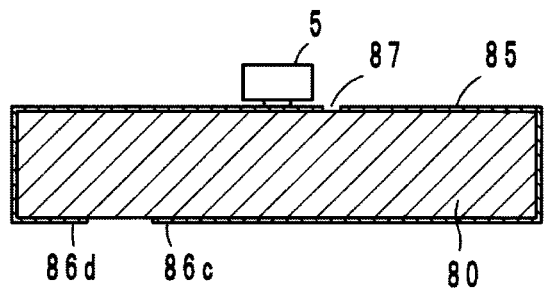
FIGS. 19A and 19B are diagrams showing a wireless IC device component according to a ninth preferred embodiment of the present invention, where
Figure 19B:
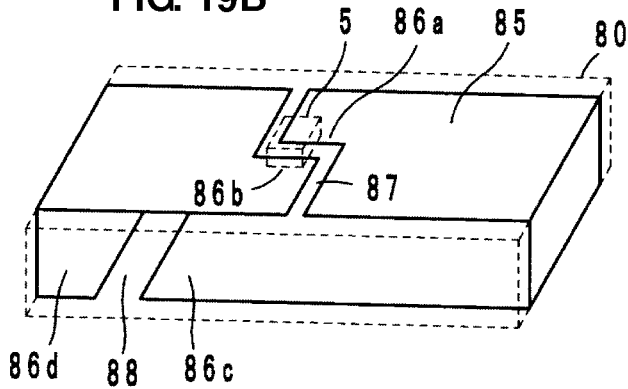

A wireless IC device component according to a ninth preferred embodiment of the present invention has the same or substantially the same configuration as that of the eighth preferred embodiment, as shown in FIGS. 19A and 19B. The wireless IC device component of the ninth preferred embodiment differs from the wireless IC device component of the eighth preferred embodiment in that the coupling portions 86a and 86b are preferably arranged at positions different from those of the pair of opposing ends 86c and 86d in a plan view. The wireless IC chip 5 may be directly mounted on the coupling portions 86a and 86b or the feed circuit board 1 on which the wireless IC chip 5 is mounted may be mounted on the coupling portions 86a and 86b, as shown in the eighth preferred embodiment.

The operational effects of the ninth preferred embodiment are similar to those of the eighth preferred embodiment. Since the opposing ends 86c and 86d are defined by a cutout portion of the coupling electrode 85, the dielectric substrate 80 is likely to be bent at this cutout portion. In the ninth preferred embodiment, since the opposing ends 86c and 86d are arranged at positions different from those of the coupling portions 86a and 86b in a plan view, the bending stress occurring at the opposing ends 86c and 86d is prevented from being transmitted to the coupling portions 86a and 86b. Accordingly, it is possible to suppress the effect of the bending stress on the wireless IC chip 5 and the feed circuit board 1 mounted on the coupling portions 86a and 86b.

Tenth Preferred Embodiment

Figure 20:
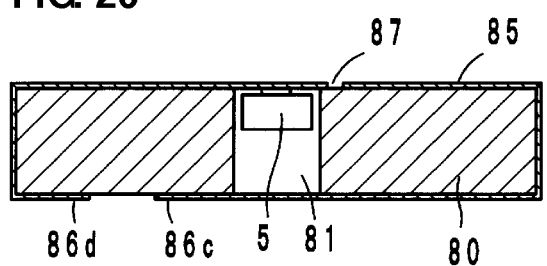
FIG. 20 is a cross-sectional view showing a wireless IC device component according to a tenth preferred embodiment.

In a wireless IC device component of a tenth preferred embodiment, a through hole 81 is preferably provided at a substantially central portion of the dielectric substrate 80, the wireless IC chip 5 is disposed in the hole 81, and the wireless IC chip 5 is coupled to the coupling portions 86a and 86b bordering on the hole 81, as shown in FIG. 20. The feed circuit board 1 may be mounted in the coupling portions 86a and 86b in a state in which the feed circuit board 1 is disposed in the hole 81.

The structure of the coupling electrode 85 in the tenth preferred embodiment is similar to the structure thereof in the ninth preferred embodiment. Accordingly, the operational effects of the tenth preferred embodiment are similar to those of the ninth preferred embodiment. In particular, in the tenth preferred embodiment, since the wireless IC chip 5 is incorporated in the dielectric substrate 80, it is possible to protect the wireless IC chip 5 from an external impact and to reduce the size of the wireless IC device component. In addition, since the opposing ends 86c and 86d are preferably arranged at positions different from those of the coupling portions 86a and 86b in a plan view, the bottom face side of the hole 81 on which the coupling portions 86a and 86b border is sealed with the coupling electrode 85. The hole may be a cavity (a housing portion) having a size sufficient to house the wireless IC chip 5, instead of the through hole.

The wireless IC device component and the wireless IC device according to the present invention are not limited to the preferred embodiments described above, and various changes and modifications may be made to the present invention without departing from the spirit and scope thereof.

For example, the materials of the radiation plate and the base shown in the above preferred embodiments are only examples, and the radiation plate and the base may be made of an arbitrary material as long as the material has necessary characteristics. Processing other than the metal bumping may be used to connect the wireless IC chip to the electrodes.

The wireless IC may be manufactured as an element in the feed circuit board. The provision of the wireless IC in the feed circuit board eliminates parasitic components in the portion in which the wireless IC is connected to the feed circuit to improve the characteristics of the wireless IC device. In addition, the height of the wireless IC device can be reduced. Furthermore, the shape and/or arrangement of the portion at which the feed circuit is coupled to the coupling electrode can be changed to cause the feed circuit to be coupled to the coupling electrode only through the electric field or the magnetic field. The coupling portions may not be defined by a pair of ends and may be linear portions as long as the wireless IC or the feed circuit can be coupled to the coupling portions. The pair of opposing ends of the coupling electrode or the opposing ends opposing the radiation plate may be capacitively coupled to each other via another electrode.

As described above, preferred embodiments of the present invention are useful for the wireless IC device components and the wireless IC devices and, in particular, preferred embodiments of the present invention are excellent in that the coupling electrode can be more satisfactorily coupled to the radiation plate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wireless IC device comprising:
   a wireless IC;
   a coupling electrode including at least one coupling portion arranged to be coupled to the wireless IC directly or via a feed circuit and a pair of ends arranged opposite to each other so as to define an annular electrode including an opening portion defined by an inner edge of the annular electrode; and
   a radiation plate coupled to the coupling electrode; wherein
   a main surface of the annular electrode is parallel or substantially parallel to a main surface of the radiation plate;
   each of the pair of ends of the annular electrode is overlapped with a portion of the radiation plate in a plan view and coupled to the portion of the radiation plate via a capacitive coupling; and
   a majority of the opening portion is not overlapped with the radiation plate in the plan view.

2. The wireless IC device according to claim 1, wherein the annular electrode is coupled to the radiation plate via a magnetic coupling.

3. The wireless IC device according to claim 2, wherein a first group of signals of a plurality of signals are externally radiated from the coupling electrode via a magnetic field, and a second group of signals of the plurality of signals are externally radiated from the radiation plate via an electric field.

4. The wireless IC device according to claim 3, wherein a resonant frequency of the coupling electrode is lower than a resonant frequency of the radiation plate.

5. The wireless IC device according to claim 1, wherein the at least one coupling portion of the coupling electrode is not overlapped with the radiation plate in the plan view.

6. The wireless IC device according to claim 1, wherein the pair of ends of the coupling electrode is coupled to a central portion of the radiation plate.

7. The wireless IC device according to claim 1, wherein the radiation plate is defined by a portion of an article to which the wireless IC device is attached.

\* \* \* \* \*

UNITED STATES PATENT AND TRADEMARK OFFICE
CERTIFICATE OF CORRECTION

| | | |
|---|---|---|
| PATENT NO. | : 8,690,070 B2 | Page 1 of 1 |
| APPLICATION NO. | : 13/794929 | |
| DATED | : April 8, 2014 | |
| INVENTOR(S) | : Noboru Kato et al. | |

It is certified that error appears in the above-identified patent and that said Letters Patent is hereby corrected as shown below:

Item (72) Inventors on the title page of the patent, please correct the First Inventor's name as follows:

-- Noboru Kato, Nagaokakyo (JP) --.

Signed and Sealed this
Twenty-second Day of July, 2014

Michelle K. Lee
*Deputy Director of the United States Patent and Trademark Office*